(12) United States Patent
Mitra et al.

(10) Patent No.: US 7,185,253 B2
(45) Date of Patent: Feb. 27, 2007

(54) COMPACTING CIRCUIT RESPONSES

(75) Inventors: Subhasish Mitra, Rancho Cordova, CA (US); Kee Sup Kim, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 812 days.

(21) Appl. No.: 10/107,628

(22) Filed: Mar. 27, 2002

(65) Prior Publication Data

US 2003/0188269 A1 Oct. 2, 2003

(51) Int. Cl.
*G01R 31/28* (2006.01)
*G06F 17/50* (2006.01)

(52) U.S. Cl. .......................... 714/734; 716/2
(58) Field of Classification Search .................. 714/30, 714/726–728, 734–736, 738–739; 716/2
See application file for complete search history.

(56) References Cited

U.S. PATENT DOCUMENTS

| 4,241,307 | A | * | 12/1980 | Hong | 324/555 |
|---|---|---|---|---|---|
| 5,450,415 | A | * | 9/1995 | Kamada | 714/727 |
| 5,831,992 | A | * | 11/1998 | Wu | 714/732 |
| 5,894,213 | A | * | 4/1999 | Nakamura | 340/146.2 |
| 6,059,451 | A | * | 5/2000 | Scott et al. | 714/726 |
| 6,401,226 | B1 | * | 6/2002 | Maeno | 714/728 |
| 6,557,129 | B1 | * | 4/2003 | Rajski et al. | 714/729 |
| 2002/0112199 | A1 | * | 8/2002 | Whetsel | 714/30 |
| 2002/0124217 | A1 | * | 9/2002 | Hiraide et al. | 714/726 |
| 2003/0115521 | A1 | * | 6/2003 | Rajski et al | 714/724 |

OTHER PUBLICATIONS

Ivanov, A. et al., "Prgrammable BIST space compactors", 1996, IEEE. pp. 1393-1404.*
Wohl, P. et al., "Design of compactors for signature analyzers in built in self test", Oct. 2001, IEEE. pp. 54-63.*
Serra, M. et al., "Space compaction for multiple-output circuits", 1998, IEEE. pp. 1105-1113.*
Cattell, K. et al., "Synthesis of one-dimensional linear hybrid cellular automata", Mar. 1996, IEEE. pp. 325-335.*

* cited by examiner

*Primary Examiner*—Stacy A Whitmore
(74) *Attorney, Agent, or Firm*—Trop, Pruner & Hu, P.C.

(57) ABSTRACT

Circuit responses to a stimulus may be compacted, decreasing the number of pin outs, without increasing the circuit element length, using a compactor. In accordance with one embodiment of the present invention, errors may be detected in scan chains used for integrated circuit testing. The number of outputs applied to output pins or other connectors may be substantially decreased, resulting in cost savings.

25 Claims, 4 Drawing Sheets

COMPACTING CIRCUIT RESPONSES

BACKGROUND

This invention relates generally to integrated circuits.

Integrated circuits include input pins for receiving signals from the outside world and output pins for providing signals to the outside world. Since integrated circuit packages are advantageously compact, increasing the number of pins means increasing the integrated circuit packaging size and cost.

For example, when testing integrated circuits, a number of modules or components may be scanned or analyzed for errors or defects. The more scan chains of modules to be analyzed, generally the more pins that are needed to receive signals from those scan chains. Conversely, the longer the scan chains, the slower the testing process. Either way, the costs may be aggravated.

Some of the major contributors to integrated circuit test cost include: available tester memory, available number of tester channels, test time, and number of pins available for scan-in and scan-out purposes. All these contributors to test cost have direct relationships with the scan chain lengths and the number of scan chains.

Therefore, there is a need for better ways to compact circuit outputs to reduce the number of circuit pins or connectors without increasing the size of the circuit elements.

DETAILED DESCRIPTION

Figure 1:
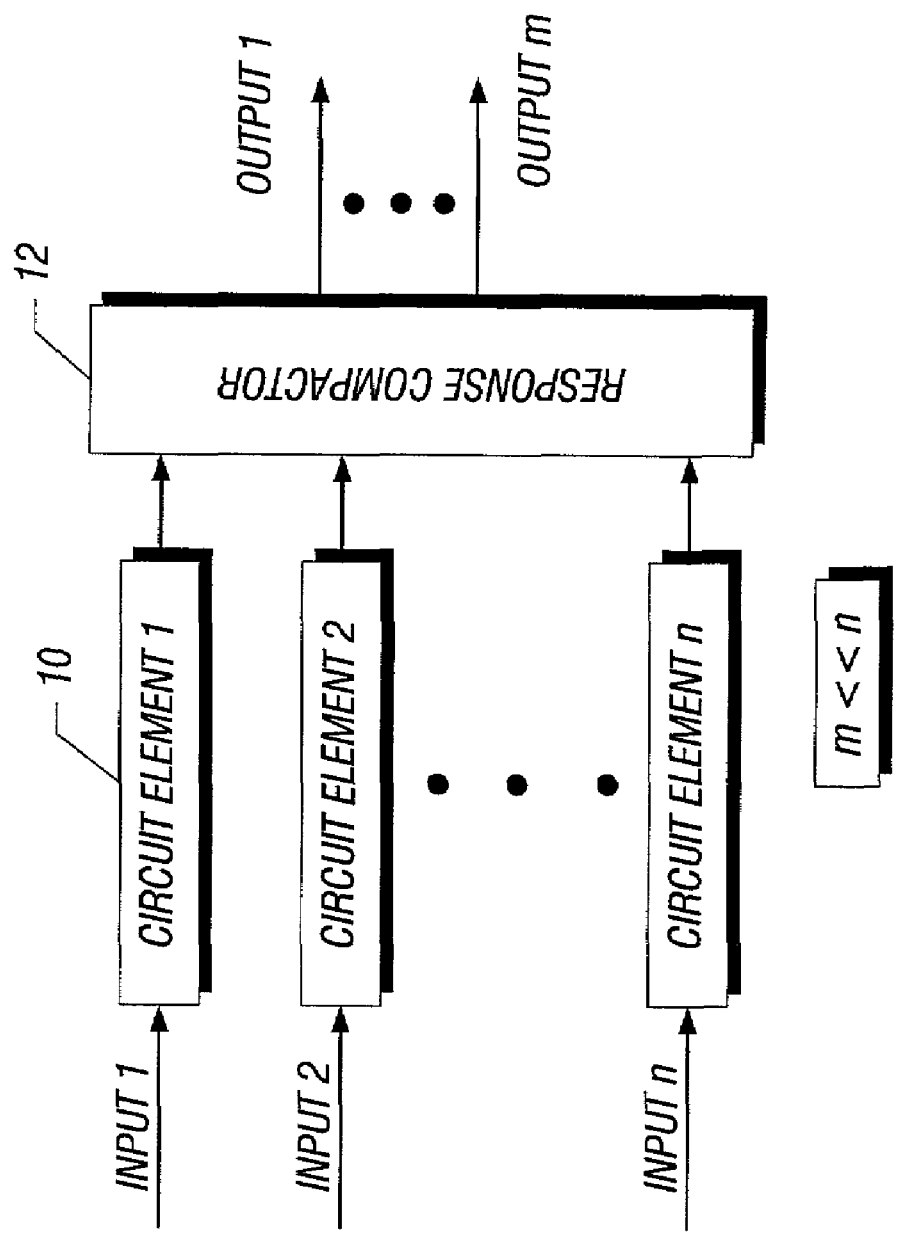
FIG. 1 is a schematic depiction of one embodiment of the present invention.

Referring to FIG. 1, a response compactor 12 may receive inputs from a plurality of circuit elements 10. Each of the circuit elements 10 may be any of a variety of circuit elements, components or modules. Each circuit element 10 receives an input such as the inputs 1 to n and provides an output that may be provided to the response compactor 12. The response compactor 12, which may be a linear network containing combinational or sequential logic such as exclusive OR or AND OR gates, provides a series of outputs 1 to m. In accordance with one embodiment of the present invention, the number of outputs is substantially less than the number of circuit elements or the number of inputs provided to the response compactor 12 from those circuit elements 10.

Thus, in some embodiments of the present invention, the response compactor 12 may facilitate integrated circuit design by reducing the number of outputs and therefore the number of pins or other types of connectors that are needed to communicate with the circuit elements 10. In particular, in a variety of circumstances, it may be desirable to reduce the outputs from a plurality of circuit elements 10 to a smaller number of outputs. One example of a reason to reduce outputs is to decrease the number of pins or connectors on an integrated circuit. However, a variety of other reasons to reduce outputs may also exist.

In the ensuing discussion, examples are provided in connection with circuits for testing integrated circuits. In such cases, a scan chain may be analyzed by providing a stimulus to the scan chain and receiving its output. In many complex integrated circuits, a large number of scan chains may each be provided with a stimulus. The responses of those scan chains may be collected. In accordance with some embodiments of the present invention, the number of outputs that are provided to pins or other connectors may be reduced using a response compactor 12. However, the present invention is not limited to testing embodiments and is applicable to a wide variety of integrated circuits.

Figure 2:
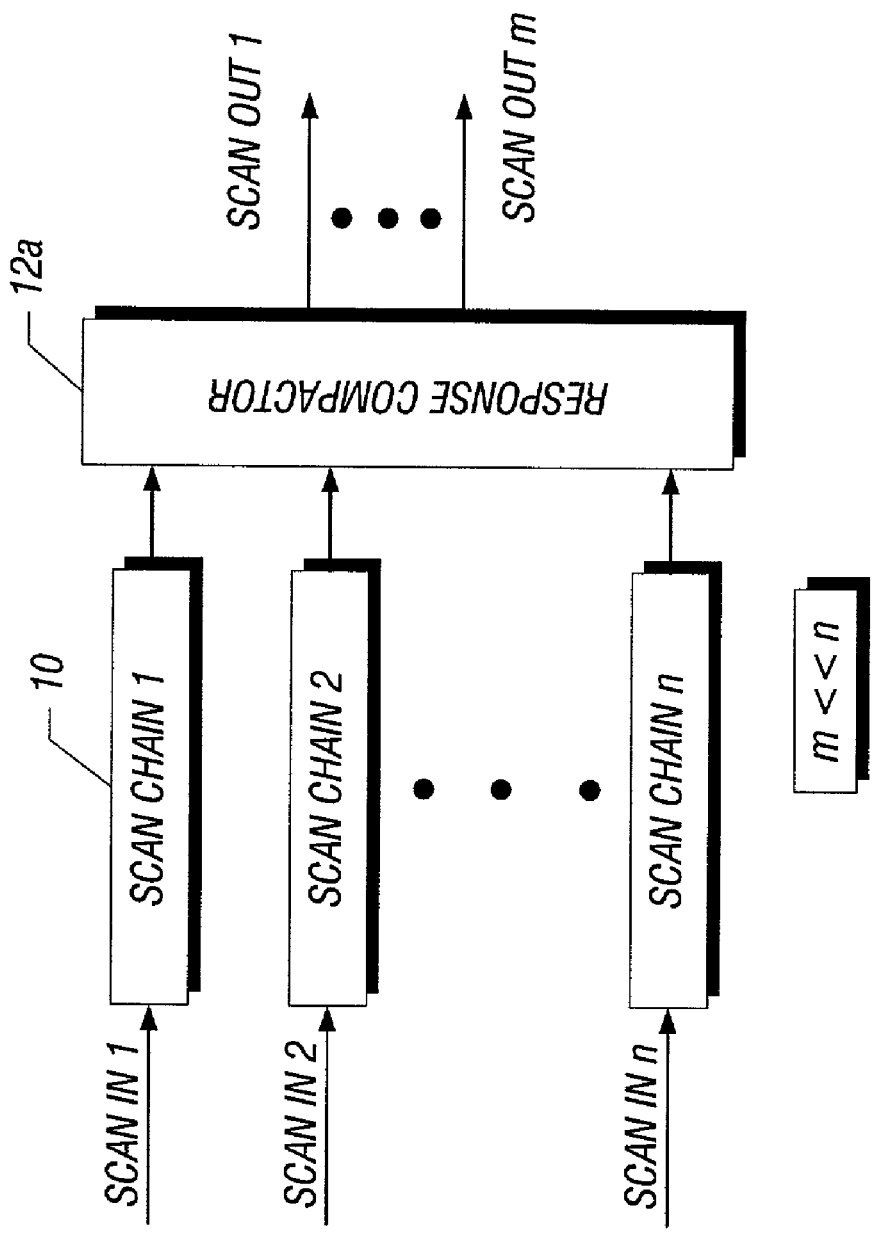
FIG. 2 is a schematic depiction of one embodiment of the present invention.

Referring to FIG. 2, a response compactor 12a may output scan-outs from 1 to m. The response compactor 12a may receive inputs from m scan chains 10a. Each of the scan chains 10a includes a scan-in, as indicated. In one embodiment of the present invention, the number of scan-outs is substantially less than the number of scan chains 10a that provide inputs to the response compactor 12a. In this way, in some embodiments, the number of necessary pins or connectors can be reduced without increasing the size of the scan chains.

For a design with n scan chains, scan chain outputs may be compacted to use significantly fewer than n scan-out pins. The number of scan-out pins (and tester channels for scan-outs) can be reduced to $\log_2 n$ without requiring any information about the layout of the scan chains. For example, a design with 250 scan chains uses 10 scan-out pins without any information about how the scan chains have been inserted.

Let us suppose that we have a design with n scan chains. Hence, the compactor design will have n inputs. Suppose that the compactor has m outputs. A compactor design can be represented as a binary matrix (matrix with only zeros and ones) with n rows and m columns. Each row corresponds to a scan chain and each column corresponds to a compactor output. The entry in row i and column j of the binary matrix is 1, if the ith scan chain output is exclusive OR-ed to generate the jth output of the compactor; the matrix entry is 0 otherwise.

Figure 3:
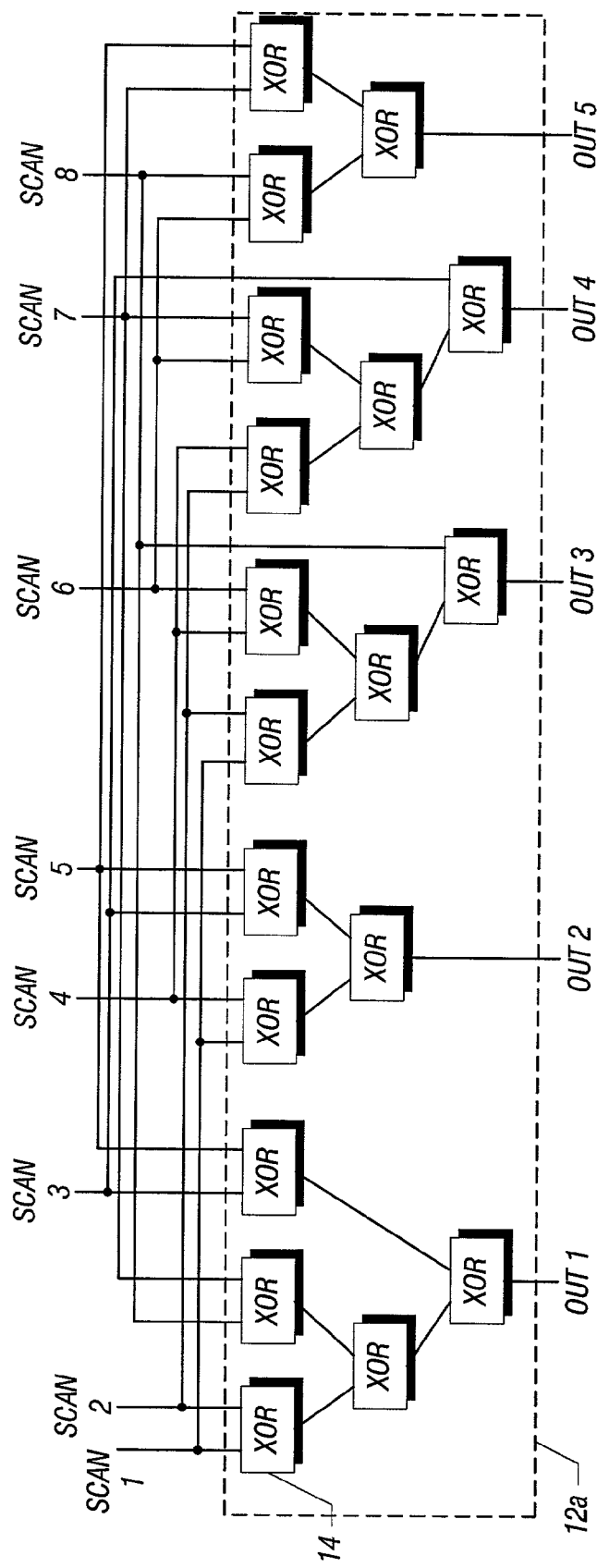
FIG. 3 is applied to a hardware depiction of another embodiment of the present invention.
Figure 4:
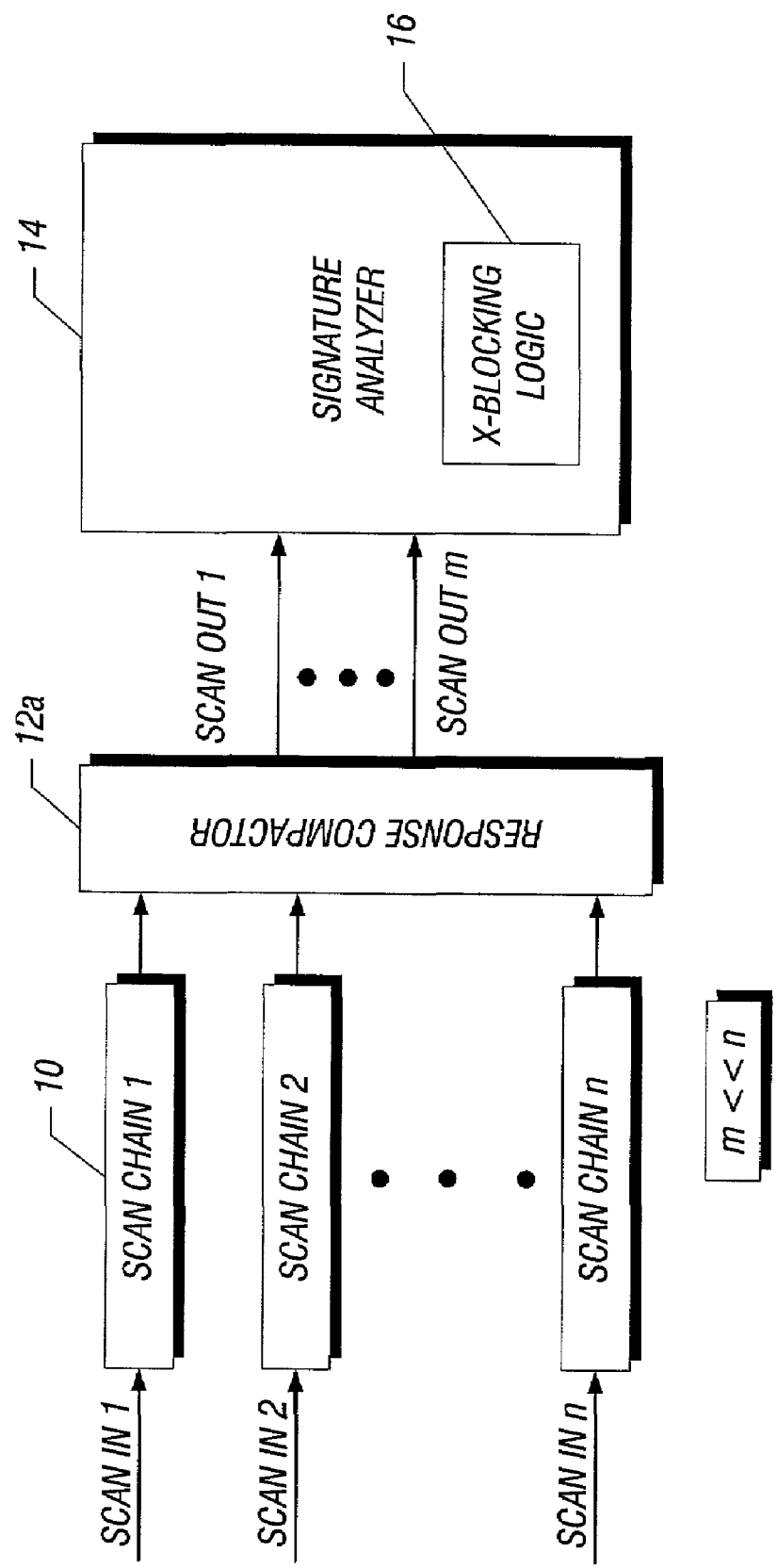
FIG. 4 is a schematic depiction of another embodiment of the present invention.

Referring to FIG. 3, a compactor 12a may include a number of exclusive OR (XOR) gates 14 coupled to eight scan chains 10a. The resulting 8×5 matrix is depicted below:

$$\begin{bmatrix} 1 & 1 & 1 & 0 & 0 \\ 1 & 0 & 1 & 1 & 0 \\ 1 & 1 & 0 & 0 & 0 \\ 0 & 1 & 1 & 1 & 0 \\ 1 & 1 & 0 & 0 & 1 \\ 0 & 0 & 1 & 1 & 1 \\ 1 & 0 & 0 & 1 & 1 \\ 1 & 0 & 0 & 0 & 1 \end{bmatrix}$$

The compactor of FIG. 3 has eight inputs (since there are eight scan chains) and five outputs. The entries in the first and second rows under the first column are one because the outputs of scan chains 1 and 2 are XOR-ed to obtain the first compactor output (scan-out 1) and the outputs of scan chains 3 and 4 are XOR-ed to obtain the second compactor output (scan-out 2). The example of FIG. 3 will detect simultaneous errors in two different scan-chains. As will be explained in more detail later, this is because all of the matrix rows are non-zero and different.

If a single scan chain produces an error at any scan-out cycle, the compactor outputs produce an error at that scan cycle if and only if no row of the compactor matrix contains all zeros. Therefore, no row of the compactor matrix contains all zeros in one embodiment.

As shown in FIG. 2, the exclusive OR gates 14 are arranged such that there is at least one exclusive OR gate 14 coupled between each input to the compactor 12a and at least one output from the compactor. Each input is also coupled to the outputs differently in accordance with one embodiment of the present invention. In other embodiments of the present invention, each input is coupled to an odd number of outputs through the exclusive OR gates 14. In still another embodiment of the present invention, the same number of inputs are coupled to each output.

If two scan chains produce errors at any scan-out cycle, the compactor outputs produce an error at that scan cycle if and only if no two rows of the compactor matrix are identical. Therefore, no two rows of the compactor matrix are identical in one embodiment. Since the compactor matrix has m columns, there are maximum $2^m-1$ distinct non-zero rows possible. Thus, the following condition may be satisfied: $n \leq 2^m-1$, where n is the number of scan chains (which is equal to the number of rows of the compactor matrix). This means, $m \geq \log_2(n+1)$. Thus, the compactor can have $\log_2(n+1)$ or more outputs when there are n scan chains. If there are 127 scan chains, for example, the compactor need only 7 scan-out pins instead of 127 scan-out pins.

When an odd number of scan chains produce errors at any scan-out cycle, the compactor outputs produce an error at that scan-out cycle if and only if the bit-wise exclusive-OR of any two rows of the compactor matrix is not equal to any other row of the compactor matrix. Therefore, the bit-wise exclusive-OR of any two rows of the compactor matrix is not equal to the bit-wise exclusive-OR of any other row of the matrix. Alternatively, every row of the compactor matrix contains an odd number of ones, in one embodiment.

Since the compactor matrix has m columns, a maximum of $2^{m-1}$ distinct non-zero rows with an odd number of ones are possible. Thus, the following condition may be satisfied: $n \leq 2^{m-1}$, where n is the number of scan chains (equal to the number of rows of the compactor matrix). This means, $m \geq 1+\log_2(n)$. If there are 127 scan chains, for example, we will need only 8 scan-out pins instead of 127 scan-out pins.

In some embodiments, only two errors in two scan chains can be detected. In other embodiments, errors in three scan chains may be detected. However, the present invention is applicable to embodiments involving errors in more than three scan chains, for example, using the concepts of BCH and Reed Solomon error detection and correction codes.

Some of the scan chains can produce logic values unknown during simulation (often called X-values) at the same scan-out cycle when some other scan chain produces an error. In that case, there is a chance that this error can get masked and the defect is not detected.

If a scan chain produces an error and another scan chain produces a logic value unknown during simulation at any scan-out cycle, the compactor outputs produce an error at that scan-out cycle if and only if no row of the compactor matrix contains all zeros. Thus, in one embodiment, no row of the matrix contains all zeros. If any two rows have ones in the same column, there must be two columns in which the same two rows have (0, 1) and (1, 0) in one embodiment. Every row of the compactor matrix is distinct, has equal numbers of ones and the numbers of ones in every row is odd, in one embodiment.

For example, let us suppose that we have a compactor matrix with 10 columns. Every row of this matrix has an equal number of ones, and the number of ones in every row must be odd. In this case, the number of rows is maximized if the number of ones in each row is 5; there are $$\binom{10}{5} = 252$$

such rows possible. In general, for a compactor matrix with 2k or 2k+1 columns, the number of rows is maximized if each row has k or k-1 ones depending on whether k is odd or even, respectively. Thus, the following relationships between n, the number of scan chains, and m, the number of compactor outputs, are satisfied:

$$n \leq \binom{m}{\frac{m}{2}-1},$$

when m divisible by 4;

$$n \leq \binom{m}{\frac{m}{2}},$$

when m divisible by 2 and not by 4;

$$n \leq \binom{m}{\frac{m-1}{2}-1},$$

when m-1 divisible by 4

$$n \leq \binom{m}{\frac{m-1}{2}},$$

when m-1 divisible by 2 and not by 4.

The design of a compactor circuit may be illustrated using the following example. Suppose that we want to design a compactor circuit with 8 inputs (corresponding to 8 scan chains) and 5 outputs. The compactor matrix has 8 rows and 5 columns and is shown below.

$$\begin{bmatrix} 1 & 1 & 1 & 0 & 0 \\ 1 & 0 & 1 & 1 & 0 \\ 1 & 1 & 0 & 1 & 0 \\ 1 & 1 & 0 & 0 & 1 \\ 1 & 0 & 1 & 0 & 1 \\ 1 & 0 & 0 & 1 & 1 \\ 0 & 1 & 0 & 1 & 1 \\ 0 & 0 & 1 & 1 & 1 \end{bmatrix}$$

The compactor matrix is designed such that each row has three ones and all rows are distinct. Consider the scan chain corresponding to the first row of the compactor matrix. If this scan chain (referred to as scan chain 1) produces an unknown logic value, the outputs at the first three compactor outputs will be unknown and masked on the tester. However, if any other scan chain produces an error at the same scan-out cycle when scan chain 1 produces an unknown value, known as an x-value, one of the remaining two compactor outputs will be erroneous. For example, if scan chain 2 produces an error, the fourth compactor output will be erroneous. Also, it is not affected by the outputs from scan chain 1. This property holds for any scan chain producing an error at the same time any other scan chain producing an unknown value.

In one embodiment of the present invention, the presence of a single x-value in a scan chain can be detected. In other embodiments, more than one x-value can be detected.

The outputs of the compactor 12a can be applied to a signature analyzer 14 such as a Multiple Input Signature Register (MISR). The unknown logic values (X-values) at the compactor 12a outputs can be blocked or masked using X-blocking (or X-masking) logic. The X-blocking logic 16 may be used to fix the X-value at the compactor outputs to zeros or ones. Alternatively, signals can be sent so that the compactor 12a outputs are either collected in a signature analyzer 14 or observed on a tester depending on whether the outputs have any X-values. The inputs of this X-blocking logic 16 can be derived in several different ways, such as primary inputs or separate scan chains.

The design of the compactor 12 may be facilitated using the following principles:

1. If a single scan chain produces an error at any scan out, the compactor outputs produce an error at that scan cycle if, and only if, no row of the compactor matrix contains all zeros;

2. If two scan chains produce errors at any scan out cycle, the compactor outputs produce an error at that cycle if, and only if, no two rows of a compactor matrix are identical;

3. When three or an odd number of scan chains produce errors at any scan out cycle, the compactor outputs produce an error at that scan out cycle if, and only if, the bitwise exclusive-OR of any two rows of a compactor matrix is not equal to any other row of the compactor matrix;

4. Number three above is satisfied if every row of the compactor matrix contains an odd number of ones;

5. If a scan chain produces an error and another scan produces a logic value unknown during simulation at any scan out cycle, the compactor outputs produce an error at that scan out cycle if, and only if, no row of the compactor matrix contains all zeros, and if any two rows have ones at the same column there must be two columns in which the same rows have (0, 1) and (1, 0);

6. Number five above is satisfied if every row of the compactor matrix is distinct, has equal numbers of ones and the number ones in every row is odd;

7. Items number two and three above are satisfied for the compactor matrix satisfying item number six above;

8. One may differentiate the situation where a single scan chain produces an error at the scan out cycle and when two scan chains produce errors at the scan out cycle if, and only if, the compactor matrix satisfies item number three above; and 9. If the bitwise exclusive-OR of two rows of a compactor matrix is equal to the compactor error vector at the scan out cycle, then it is possible that the scan chains corresponding to these two rows produce errors at that scan out cycle.

There are many ways to access the contents of the scan chains during diagnosis. First, while scanning patterns out in the diagnosis mode, the scan chains can be configured into longer scan chains (by concatenating multiple scan chains) and the contents of these chains can be shifted out using the scan-out pins. Alternatively, in the diagnosis mode, we can apply select signals to scan-out one or more scan chain contents directly through the scan-out pins bypassing the compactor circuit.

However, for most practical cases, one can identify the failing scan chain and the failing flip-flop in the scan chain directly from the compactor outputs collected on the tester (also called tester data-log) without having to configure the scan chains in diagnosis mode. This is because the failing scan chain can be uniquely identified as long as only one scan chain produces error at any scan-out cycle. Once the scan chain is identified it is very easy to identify the failing flip-flop from the scan-out cycle information.

Thus, in accordance with some embodiments of the present invention, where no more than two scan chains produce errors, by making the matrix for the compactor have all non-zero rows that are different, all errors will be detected. Similarly, where three scan chains produce errors, by making the compactor with a matrix whose rows are non-zero, different, and have an odd number of ones, all errors can be detected. Finally, if one scan chain produces an error and one scan chain produces an indeterminate or unknown state during simulation, called an x-value, this may be detected if all rows are non-zero, different and have equal and odd numbers of ones in their matrices.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
providing a compactor characterized by a binary matrix having a row for each of a plurality of circuit elements and a column for each compactor output;
making all of the matrix rows non-zero and different from each of the other rows; and
making all of the matrix rows have an odd number of ones.

2. The method of claim 1 including making all of the rows have an equal number of ones.

3. The method of claim 1 including providing a compactor for the outputs of a plurality of circuit elements in the form of scan chains.

4. The method of claim 1 including forming a compactor using exclusive OR gates.

5. A device comprising:
n input terminals, where n is an integer value of at least 2;
m output terminals where m is less than n; and
said device having a binary matrix having a row for each of a plurality of circuit elements and column for each output, all of the matrix rows being non-zero and each of said rows being different from each of the other rows, wherein all of said matrix rows have an odd number of ones.

6. The device of claim 5 wherein all of the matrix rows have an equal number of ones.

7. The device of claim 5 wherein said circuit elements are scan chains.

8. The device of claim 7 including an array of exclusive OR gates.

9. A method comprising:
providing a compactor characterized by a binary matrix having a row for each of a plurality of scan chains and a column for each compactor output;
making all of the matrix rows non-zero and different from each of the other rows; and
forming a compactor matrix using exclusive OR gates.

10. The method of claim 9 including making all of the matrix rows have an odd number of ones.

11. The method of claim 10 including making all of the rows have an equal number of ones.

12. A device to compact scan chain responses comprising:
n input terminals;
m output terminals, where m is less than n;
said device having a binary matrix having a row for each of a plurality of circuit elements and a column for each output, all of the matrix rows being non-zero and all of said rows being different from each of the other rows; and
an array of exclusive OR gates.

13. The device of claim 12 wherein all of the matrix rows have an odd number of ones.

14. The device of claim 13 wherein all of the matrix rows have an equal number of ones.

15. The device of claim 12 wherein said device can detect at least two errors in two different scan chains.

16. The device of claim 15 wherein said device can detect at least three errors in three different scan chains.

17. The device of claim 12 wherein said device can detect at least one error and one scan chain and an x-value in another scan chain.

18. A method comprising:
coupling a plurality of inputs to a smaller number of outputs through exclusive OR gates;
coupling said inputs to said outputs so that at least one exclusive OR gate is coupled between each input and at least one output;
coupling said inputs to said outputs so that each input is coupled to said outputs differently; and
designing a compactor using the principles that if a single scan chain produces an error at any scan out, the compactor outputs produce an error at that scan cycle if, and only if, no row of the compactor matrix contains all zeros, if two scan chains produce errors at any scan out cycle, the compactor outputs produce an error at that cycle if, and only if, no two rows of a compactor matrix are identical, where three or an odd number of scan chains produce errors at any scan out cycle, the compact outputs produce an error at that scan out cycle if, and only if, the bitwise exclusive-OR of any two rows of a compactor matrix is not equal to any other row of the compactor matrix, if a scan chain produces an error and another scan chain produces a logic value unknown during simulation in any scan out cycle, the compactor outputs produce an error at that scan out cycle if, and only if, no row of the compactor matrix contains all zeros, and if any two rows have one at the same column there must be two columns in which the same rows have (0,1) and (1,0) and differentiating the situation where a single scan chain produces an error at the scan out cycle and the compactor outputs produce an error at that scan out cycle if, and only if, the bitwise exclusive-OR of any two rows of the compactor matrix is not equal to any other row of the compactor matrix, and if the bitwise exclusive-OR of two rows of a compactor matrix is equal to a compactor error vector at the scan out cycle, then it is possible that the scan chains corresponding to these two rows produce errors at that scan out cycle.

19. The method of claim 18 including coupling each input to an odd number of outputs through exclusive OR gates.

20. The method of claim 18 including coupling the same number of inputs to each output.

21. The method of claim 18 including detecting at least two errors in two different scan chains simultaneously.

22. The method of claim 18 including detecting at least three errors simultaneously in three different scan chains.

23. The method of claim 18 including while scanning patterns out in a diagnosis mode, configuring the scan chains into longer scan chains by concatenating multiple scan chains and shifting the contents of these chains out using scan out pins.

24. The method of claim 18 including applying select signals to scan out one or more scan chains directly through scan out pins bypassing a compactor circuit.

25. The method of claim 18 including identifying a failing scan chain and a failing flip flop in a scan chain directly from the compactor outputs collected on a tester without having to configure the scan chains in a diagnosis mode.

* * * * *